(12) United States Patent
Chegal

(10) Patent No.: US 7,342,576 B2
(45) Date of Patent: Mar. 11, 2008

(54) DRIVING CIRCUIT OF LIQUID CRYSTAL DISPLAY

(75) Inventor: Seung Won Chegal, Kyoungki-do (KR)

(73) Assignee: Boe Hydis Technology Co., Ltd., Kyoungki-do (KR)

( * ) Notice: Subject to any disclaimer, the term of this patent is extended or adjusted under 35 U.S.C. 154(b) by 727 days.

(21) Appl. No.: 10/934,151

(22) Filed: Sep. 3, 2004

(65) Prior Publication Data
US 2005/0151715 A1 Jul. 14, 2005

(30) Foreign Application Priority Data
Dec. 30, 2003 (KR) .................. 10-2003-0100227

(51) Int. Cl.
G09G 5/00 (2006.01)
(52) U.S. Cl. ................. 345/204; 345/94; 345/98
(58) Field of Classification Search ............ 345/60, 345/63, 87, 94, 97, 98, 100
See application file for complete search history.

(56) References Cited

U.S. PATENT DOCUMENTS

| | | | |
|---|---|---|---|
| 4,277,676 A * | 7/1981 | Kammerer | 377/15 |
| 6,281,869 B1 * | 8/2001 | Seino | 345/99 |
| 6,621,481 B1 * | 9/2003 | Kanbara | 345/100 |
| 6,989,824 B1 * | 1/2006 | Ishii et al. | 345/204 |
| 2001/0048109 A1 * | 12/2001 | Murade | 257/72 |
| 2002/0163493 A1 * | 11/2002 | Matsushima et al. | 345/98 |
| 2004/0041772 A1 * | 3/2004 | Yamashita et al. | 345/98 |
| 2005/0018107 A1 * | 1/2005 | Uamashita et al. | 349/98 |

* cited by examiner

Primary Examiner—Bipin Shalwala
Assistant Examiner—Vincent E. Kovalick
(74) Attorney, Agent, or Firm—Ladas & Parry LLP

(57) ABSTRACT

Disclosed is a liquid crystal display device including a liquid crystal panel having a shift register therein and an interface circuit for adjusting DC and AC levels, for compensating for a loss caused by elements and a resister of the shift register. A driving circuit of the liquid crystal display device includes a clock generation unit outputting a first clock signal as a gate clock signal, a second clock signal as an inverse signal of the first clock signal, and a start pulse, and a DC and AC level amplification unit for amplifying the first and second clock signals and the start pulse after adjusting DC and AC levels of the first and second clock signals and the start pulse, and outputting the first and second clock signals and the start pulse to the shift register.

5 Claims, 7 Drawing Sheets

DRIVING CIRCUIT OF LIQUID CRYSTAL DISPLAY

BACKGROUND OF THE INVENTION

1. Field of the Invention

The present invention relates to a liquid crystal display device, and more particularly to a driving circuit of a liquid crystal display device capable of variously adjusting a signal level in match with a characteristic of a liquid crystal panel by integrating a driver IC on the liquid crystal panel in order to make the liquid crystal panel in a compact size while reducing a manufacturing cost thereof.

2. Description of the Prior Art

In general, a CRT (cathode ray tube), which is one of display devices, is mainly used in monitors of televisions, various measurement apparatuses, and information terminals. However, the CRT has a heavy weight and a big size, so the CRT is not adaptable for electronic appliances having a small size and a light weight.

Accordingly, liquid crystal display devices having a slimmer and compact size with a light weight have been actively developed in order to substitute for CRTs. Recently, liquid crystal display devices have been developed as flat panel type display devices, and demand for the liquid crystal display devices has significantly increased.

Such a liquid crystal display is a sort of flat panel type display devices including two glass substrates and a liquid crystal layer formed between two glass substrates. Herein, gate lines and data lines defining pixel regions are formed on a lower substrate of the liquid crystal display panel such that gate lines and data lines are aligned in cross to each other. Also, a pixel electrode and a thin film transistor switched by a driving signal of the gate line in order to apply a signal of the data line to the pixel electrode, are aligned in each pixel region. In addition, a black matrix is aligned on an upper glass substrate of the liquid crystal display panel so as to prevent light from radiating into regions in which pixel electrodes are not formed. Also, a color filter layer is formed in each of the pixel regions by interposing the black matrix between pixel regions, and a common electrode is aligned at a front surface of the upper glass substrate.

FIG. 1 is a view showing a structure of a liquid crystal display device. Such liquid crystal display device mainly includes a liquid crystal panel 11 used for displaying images, in which a plurality of gate lines and data lines are aligned in cross to each other and thin film transistors are aligned at cross points of the gate lines and data lines, a source driver IC 13 for applying a driving voltage to the data lines of the liquid crystal panel 11, and a gate driver IC 15 for applying driving voltage to the gate lines of the liquid crystal panel 11.

In addition, even though it is not illustrated, the liquid crystal display device includes peripheral circuits, such as an LVDS unit and a timing controller, applying various control signals to the source driver IC 13 and the gate driver IC 15.

An operation of the gate driver IC 15 is shown as a timing view in FIG. 2.

That is, referring to FIG. 2, a CPV signal having a level of 3.3V, which is a clock signal, is inputted into the gate driver IC 15. Also, when an STV1 signal, which is a start pulse signal having a level identical to that of the CPV signal, is inputted into the gate driver IC 15. When the STV1 signal is maintained in a high level, an output pulse signal (out 1) of an out1 line is selected at a rising point of the CPV signal, so that the selected pulse signal (out 1) is shifted into a next line. Also, the shifted pulse signal is operated as a start pulse signal of the next line, so an output pulse signal (out 2) of an out2 line is selected at a rising point of the CPV signal.

In this manner, such as shown in FIG. 3, a gate output selected while the output pulse signal is being shifted to the next line is applied to a liquid crystal panel 11 through a shift register unit 15a, a level shift unit 15b, and a buffer 15c installed in a chip. At this time, a voltage applied to the liquid crystal panel 11 has a gate ON/OFF voltage level for driving a liquid crystal.

However, such a liquid crystal display device creates the voltage capable of driving a liquid crystal cell in an external circuit consisting of a single IC chip, so the degree of freedom for selecting designs of an external appearance of the liquid crystal display device may be limited.

Accordingly, in order to solve the above problem, a shift register shown in FIG. 4 and a level shifter shown in FIG. 5 have been proposed.

That is, the shift register shown in FIG. 4 includes n number of stages $12_1$ to $12_n$ sequentially connected to a start pulse input line and n number of level shifters $13_1$ to $13_n$ sequentially connected to output lines of the stages $12_1$ to $12_n$ for driving an m×n pixel array. The level shifters $13_1$ to $13_n$ and output lines $14_1$ to $14_n$ are connected to n number of row lines $ROW_1$ to $ROW_n$ included in the pixel array, respectively.

The first stage $12_1$ controlled by a start pulse SP and two clock signals selected from among four clock signals $C_1$ to $C_4$ outputs a clock signal to the next stage $12_2$ and the first level shifter $13_1$. Also, the first level shifter $13_1$ receives one of four clock signals $C_1$ to $C_4$ outputted from the first stage $12_1$, which is not inputted into the first stage $12_1$. In addition, the first level shifter $13_1$ is controlled by clock signals inputted thereto so as to select row lines ROWi connected to the pixel line.

Meanwhile, according to the level shifter as shown in FIG. 5, each of the stages $12_1$ to $12_n$ includes a first NMOS transistor T1 connected between a fourth node P4$i$ of a previous stage $12_{i-1}$ and a first node P1 of a stage $12_i$, a second NMOS transistor T2 connected among the first node P1, a second node P2 and a basis voltage line 10, a third NMOS transistor T3 connected among a feeding line 8, a second clock signal line 6c and the second node P2, a fourth NMOS transistor T4 connected between the second node P2 and the basis voltage line 10, a first capacitor Cgd connected between a third node P3 and the basis voltage line 10, a fifth NMOS transistor T5 connected among the first node P1, a first clock signal line 6a and the third node P3, and a sixth NMOS transistor T6 connected among the second node P2, the third node P3 and the basis voltage line 10.

In addition, each of the level shifters includes a seventh NMOS transistor T7 connected among a second clock signal line 6b, a fifth node P5 and a sixth node P6, an eighth NMOS transistor T8 connected among the fifth node P5, a high voltage feeding line 11 and the sixth node P6, a second capacitor CLS connected between the sixth node P6 and an output line 14$i$, a ninth NMOS transistor T9 connected among the output line 14$i$, the high voltage feeding line 11 and a source electrode of the eighth NMOS transistor T8, and a tenth NMOS transistor T10 connected among the output line 14$i$, the basis voltage line 10 and a gate electrode of the seventh NMOS transistor T7.

However, if the level shifter having the above-mentioned construction is installed in the liquid crystal panel, it is difficult to deal with an internal gate line delay. In addition, it is difficult to precisely adjust a level if the level shifter is accommodated in the liquid crystal panel, thereby causing the shift register to malfunction.

SUMMARY OF THE INVENTION

Accordingly, the present invention has been made to solve the above-mentioned problems occurring in the prior art, and it is an object of the present invention to provide a liquid crystal display device, in which a shift register is installed in a liquid crystal panel and an interface circuit capable of regulating a DC level and an AC level is mounted at an outside of the liquid crystal panel, for compensating for a loss caused by elements and a resister device of the shift register by inputting a signal having a regulated level to the shift register.

In order to achieve the above objects, there is provided a driving circuit of a liquid crystal display, which applies a signal to a shift register installed in a gate driver IC, the driving circuit comprising: a clock generation unit outputting a first clock signal which is a gate clock signal, a second clock signal which is an inverse signal of the first clock signal, and a start pulse by receiving a gate clock signal and a start pulse; and a DC and AC level amplification unit amplifying the first and second clock signals and the start pulse after adjusting DC levels and AC levels of the first and second clock signals and the start pulse, and outputting the first and second clock signals and the start pulse to the shift register.

According to the preferred embodiment of the present invention, the clock generation unit includes an inverter outputting the first clock signal by inversely converting the second clock signal, a MUX, into which an output signal of the inverter is inputted as an input signal, having an STV signal as a selection signal, a first flip/flop having an input port for receiving an output signal of the MUX and outputting the second clock signal by using a CPV signal as a clock signal, and a second flip/flop having an input port for receiving the STV signal and outputting the start pulse by using the CPV signal as the clock signal.

The first and second clock signals and the start pulse inputted into the clock generation unit and the first and second clock signals and the start pulse inputted into the level shifter have waveforms identical to each other and levels different from each other.

Also, the DC and AC level amplification unit includes a DC level adjustment unit for adjusting the DC level through a gate ON pull-up and a gate OFF pull-down by setting a gate ON signal with a pull-up voltage and a gate OFF signal with a pull-down voltage, an AC level adjustment unit for adjusting AC levels of the first and second clock signals and the start pulse having adjusted DC levels through adjusting a gain by using a variation resistance, and an amplification unit amplifying first and second clock signals and the start pulse having adjusted AC and DC levels through adjusting a gain by using a differential amplifier.

The DC level is preferably adjusted within a range between the gate ON voltage and the gate OFF voltage.

BRIEF DESCRIPTION OF THE DRAWINGS

The above object, features and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of the present invention will be explained with reference to the accompanying drawings.

Figure 1:
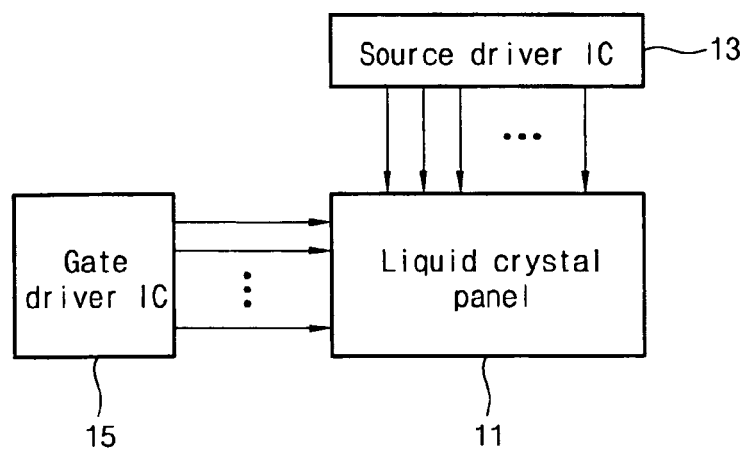
FIG. 1 is a view showing a structure of a liquid crystal display.
Figure 2:
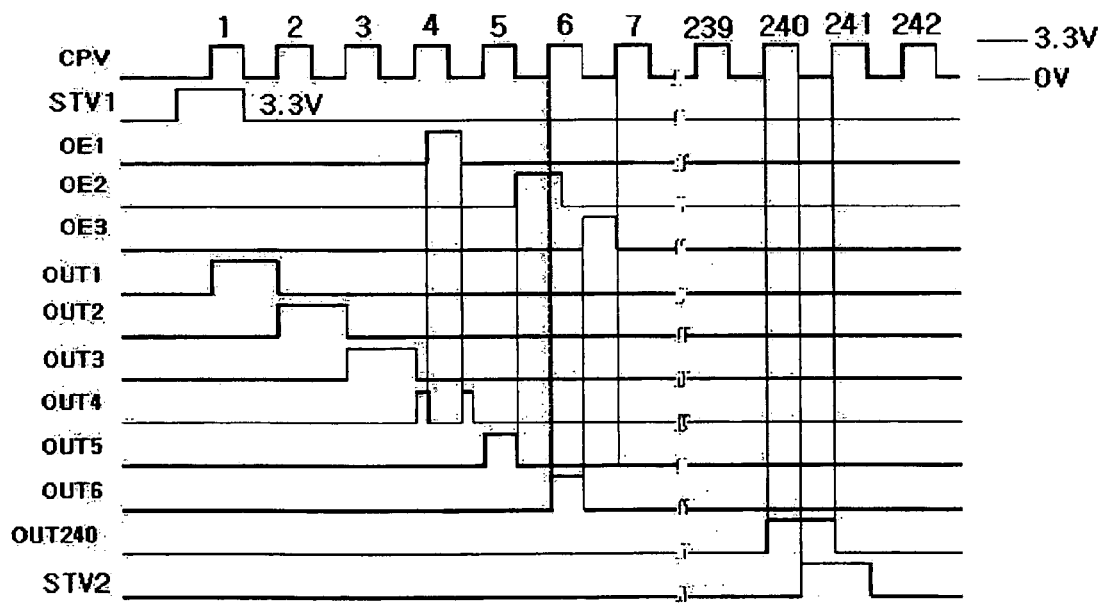
FIG. 2 is an operational timing view of a conventional gate driver IC.
Figure 3:
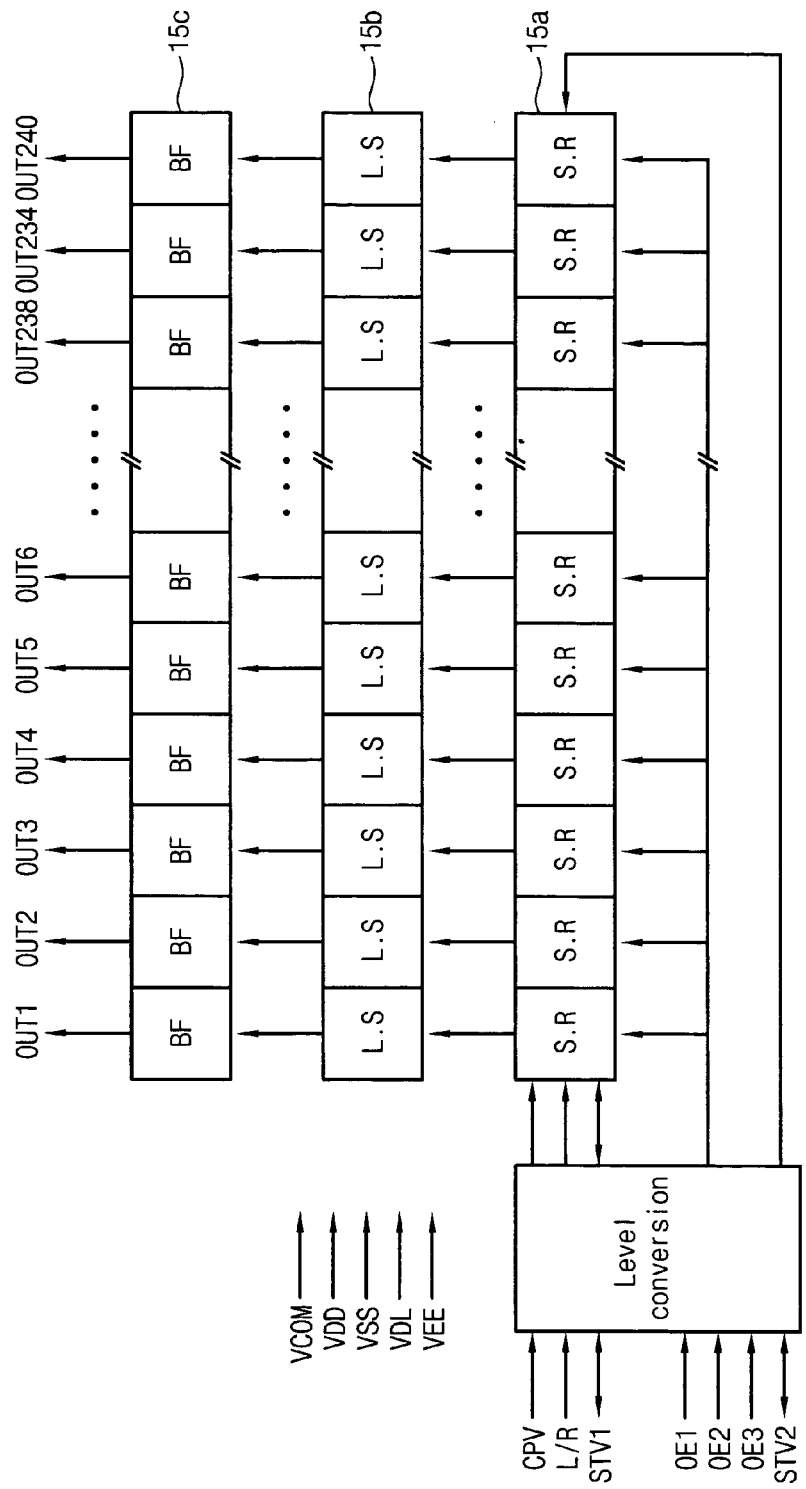
FIG. 3 is a view showing a structure of a conventional gate driver IC.
Figure 4:
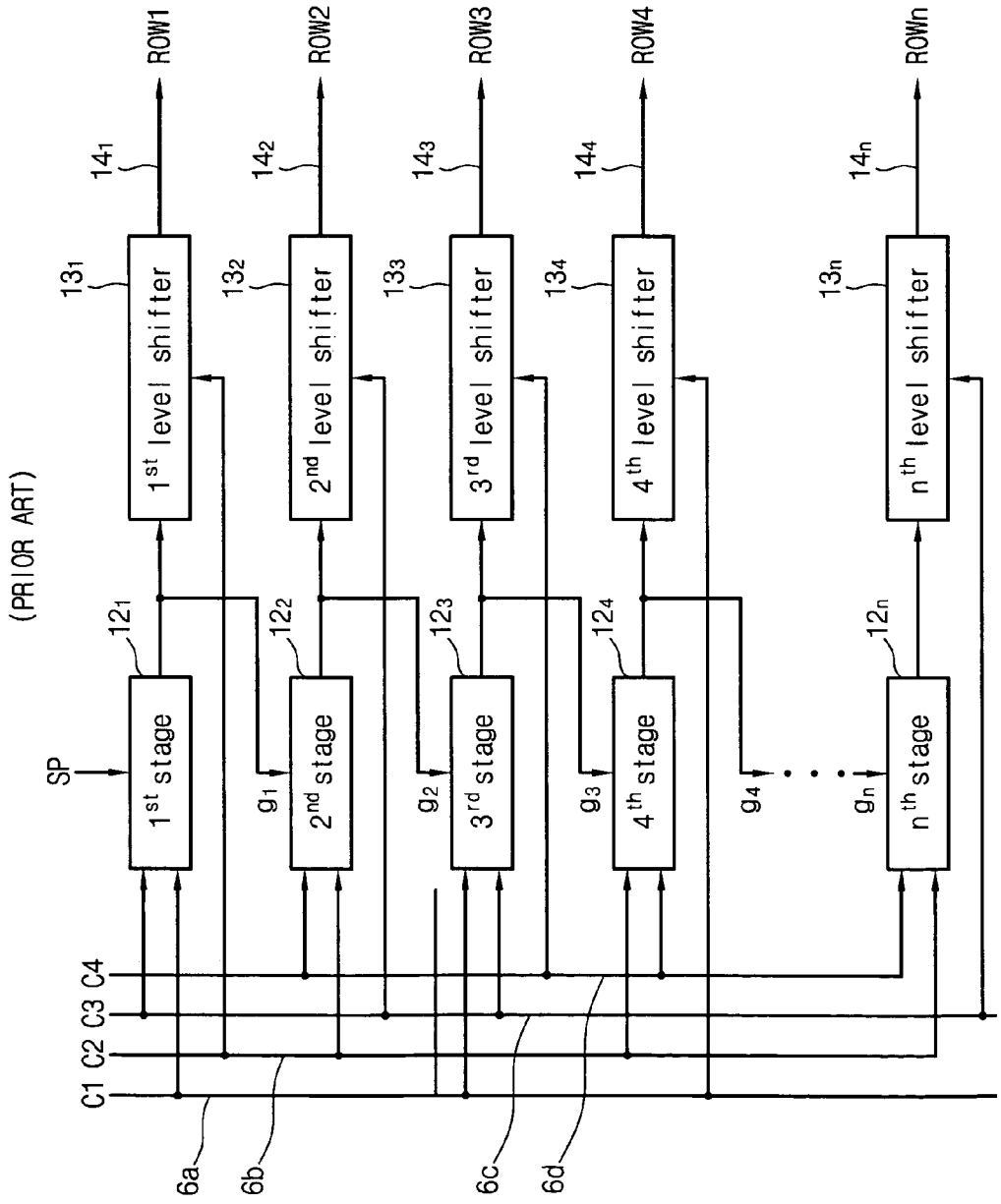
FIG. 4 is a view showing a structure of a conventional shift register.
Figure 5:
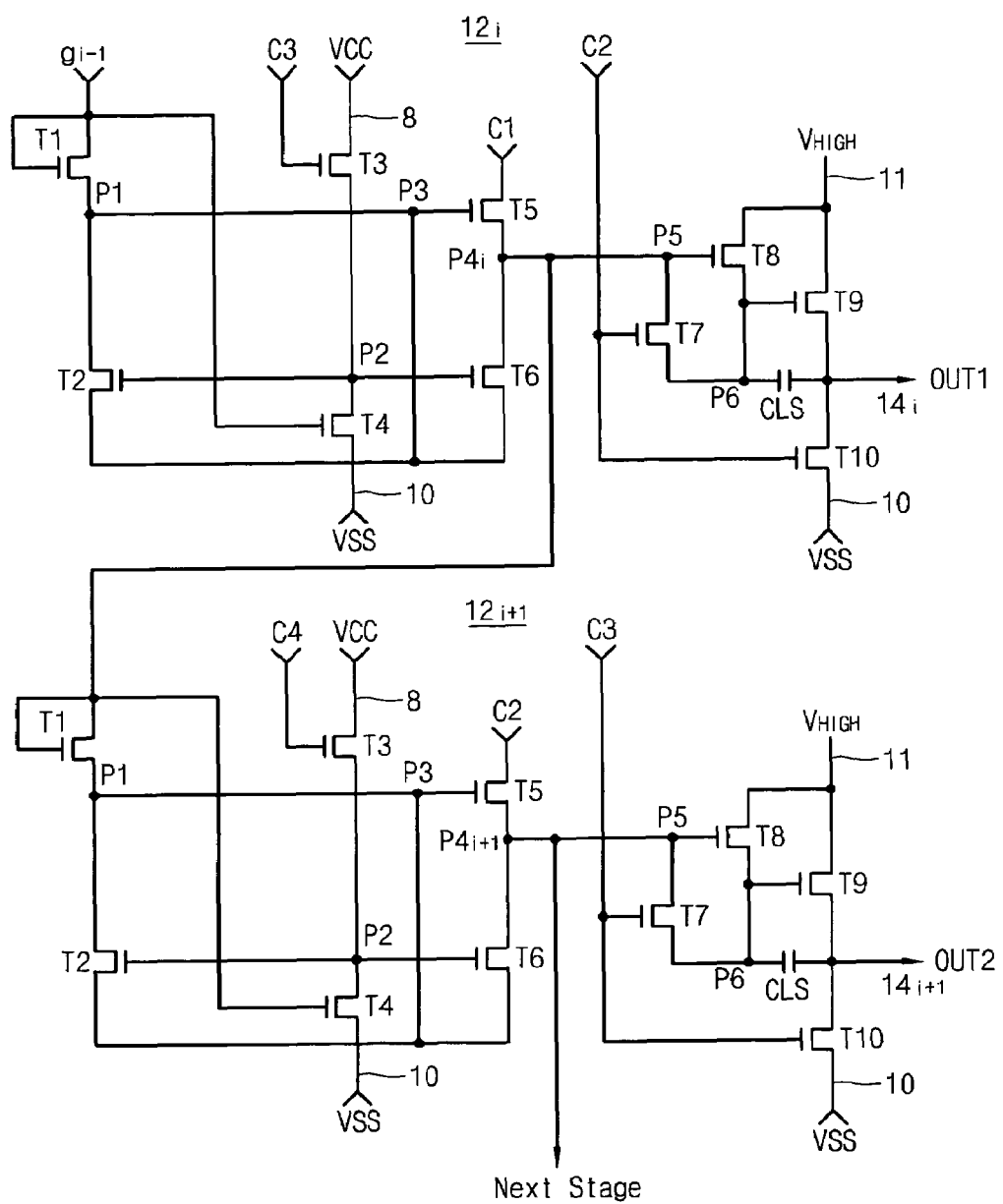
FIG. 5 is a view showing a structure of a conventional level shifter.
Figure 6:
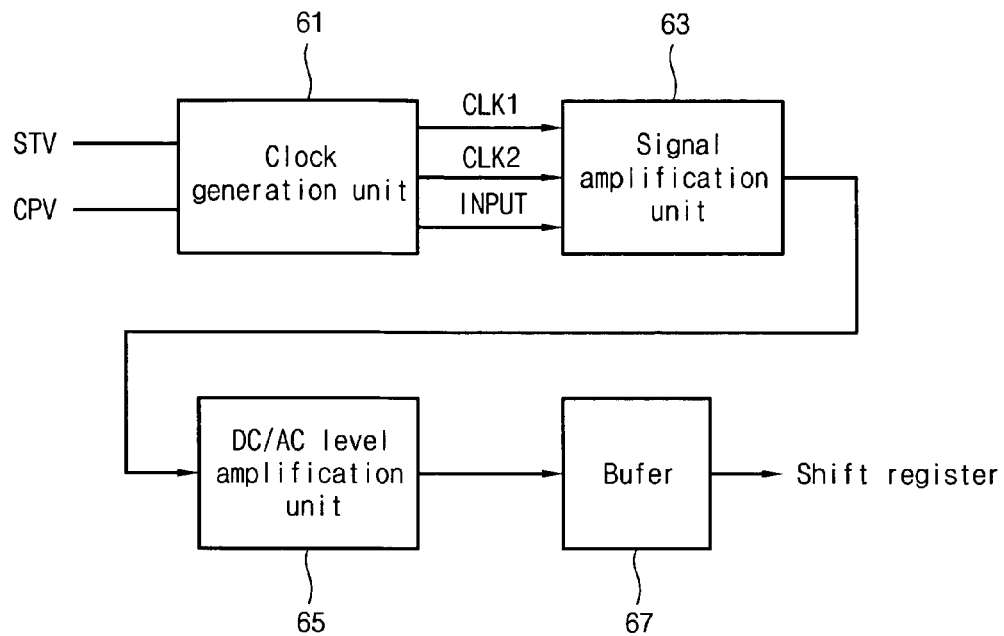
FIG. 6 is a block view showing a structure of a driving circuit of a liquid crystal display device according to the present invention.
Figure 7:
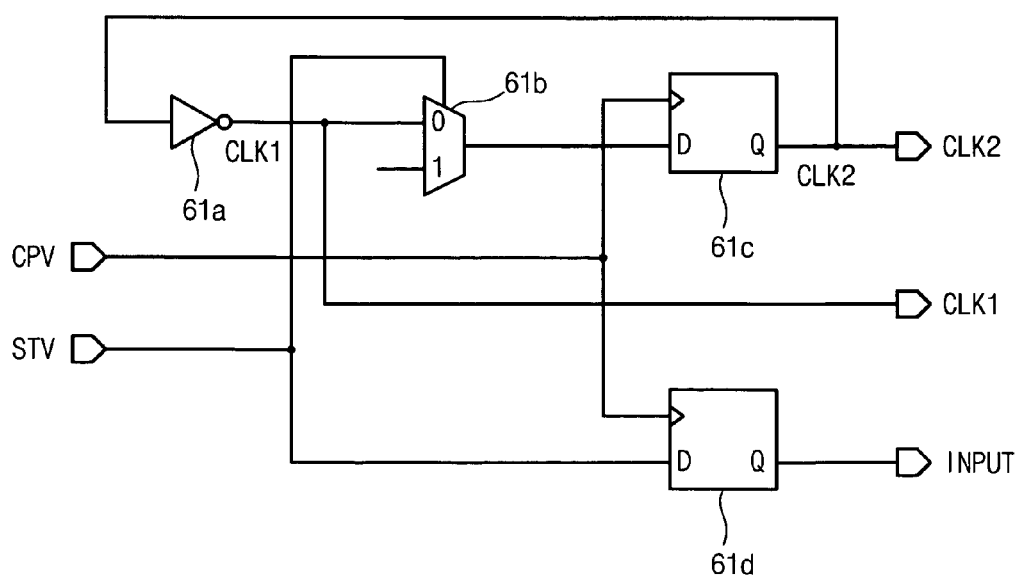
FIG. 7 is a block view showing a structure of a clock generation unit shown in FIG. 6.
Figure 8:
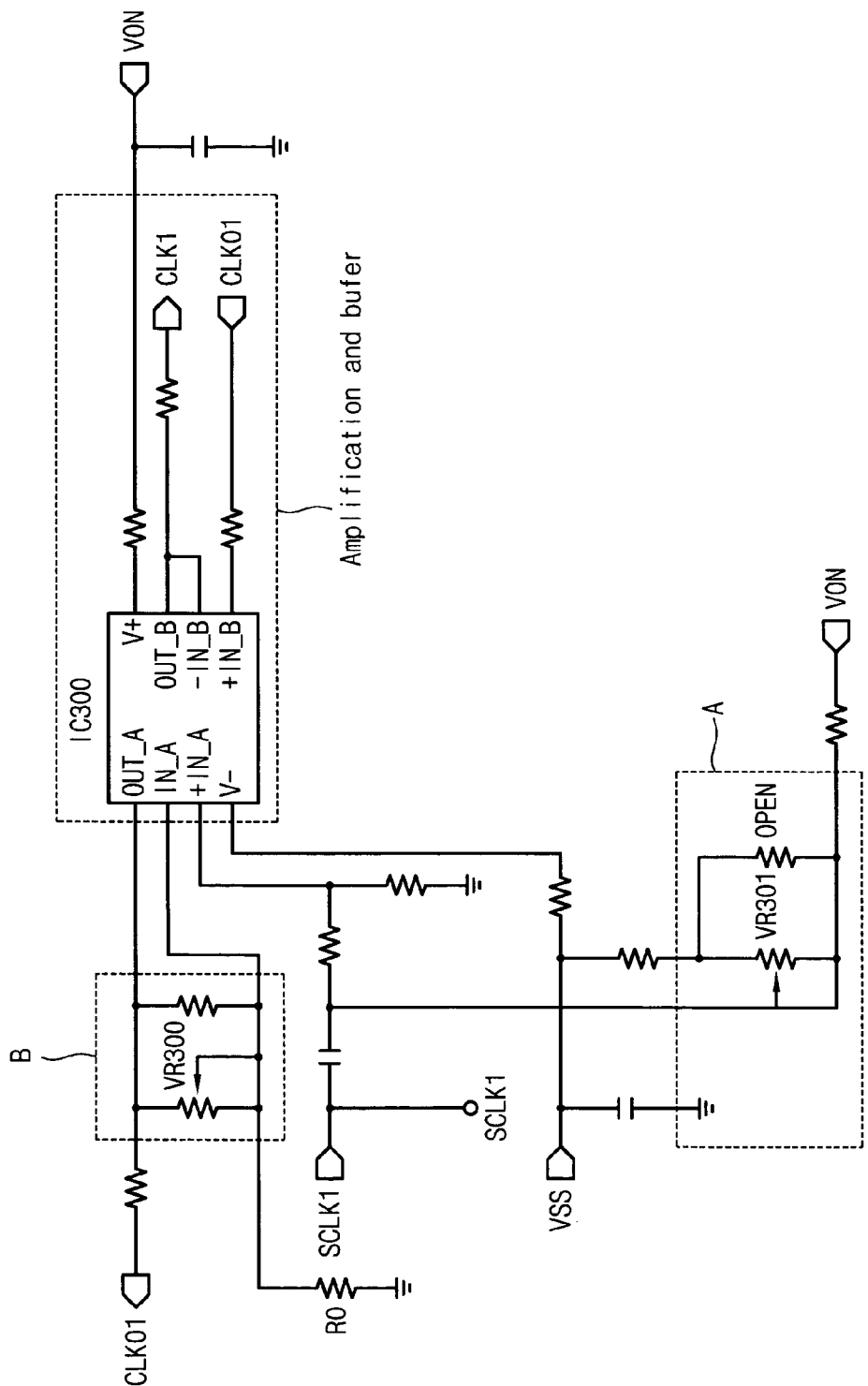
FIG. 8 is a view showing a circuit of a signal amplification unit shown in FIG. 6.

FIG. 6 is a block view showing a structure of a driving circuit of a liquid crystal display device according to one embodiment of the present invention, and FIGS. 7 and 8 are views partially showing the driving circuit structure shown in FIG. 6. For example, FIG. 7 is a block view showing a circuit of a clock generation unit shown in FIG. 6, and FIG. 8 is a view showing a circuit of a DC and AC level adjustment unit and a buffer unit shown in FIG. 6.

Referring to FIG. 6, the driving circuit of the liquid crystal display device according to the present invention includes a clock generation unit 61 outputting a first clock signal CLK1 which is a clock signal of a gate driver IC, a second clock signal CLK2 which is a reversal signal of the first clock signal, and a start pulse input signal INPUT by receiving CPV and STV signals as input signals, a signal amplification unit 63 amplifying a signal outputted from the clock generation unit 61, a DC/AC level adjustment unit 65 for adjusting a DC level and an AC level of a signal outputted from the signal amplification unit 63, and a buffer unit 67 outputting a signal having an adjusted level to a shift register after buffering the level adjusted signal.

Such driving circuit is a circuit for sequentially driving gate lines in which a signal having adjusted DC and AC levels is inputted into a shift register and is shifted into the gate. Also, the clock generation unit 61 includes an inverter 61$a$, a MUX 61$b$, and first and second flip/flops 61$c$ and 61$d$ shown in FIG. 7.

At this time, the first and second flip/flops 61$c$ and 61$d$ preferably include D flip/flops.

Hereinafter, an operation of the clock generation unit shown in FIG. 7 will be explained.

If the second clock signal CLK2 passes through the inverter 61$a$, the second clock signal CLK2 is inversed so that the second clock signal CLK2 is changed into the first clock signal CLK1. Also, the first clock signal CLK1 outputted from the inverter 61$a$ is inputted into the MUX 61$b$ using the STV signal as a selection signal.

An output signal of the MUX 61$b$ is inputted into a D port of the first flip/flop 61$c$, into which a CPV signal is inputted as a clock signal. Also, the first flip/flop 61$c$ outputs the second clock signal CLK2, which is an output signal of a clock generation unit 61.

Meanwhile, the STV signal is inputted into a D port of the second flip/flop 61*d*, into which the CPV signal is inputted as a clock signal. Also, the second flip/flop 61*d* outputs the start pulse input signal INPUT, which is an output signal of the clock generation unit 61.

At this time, the first clock signal CLK1 outputted from the clock generation unit 61 becomes an output signal of the inverter 61*a*.

Through the above manner, DC/AC levels of the first clock signal CLK1, the second clock signal CLK2, and the start pulse input signal INPUT outputted from the clock generation unit 61 are adjusted, and then, the level-adjusted signals are inputted into a shift register.

Hereinafter, the description will be made in detail with reference to FIG. 8. For the purpose of clarity, a first clock signal inputted into the signal amplification unit is referred to as SCLK1, a second clock signal inputted into the signal amplification unit is referred to as SCLK2, and a start pulse input signal inputted into the signal amplification unit is referred to as SINPUT. Also, waveforms of the SCLK1, SCLK2, and SINPUT signals are identical to waveforms of the CLK1, CLK2, and INPUT signals, but levels of the SCLK1, SCLK2, and SINPUT are formed in a range about 0V to 3.3V.

That is, as shown in FIG. 8, the SCLK1 is inputted into a non-invert port +IN_A of the amplification unit, and an inverter port −IN_A is connected to a ground GND through a resister R0. The resister R0 acts as a gain function of an amplification degree.

In addition, $V_{ON}$, which is gate ON voltage, is inputted into a V+ port V+, and $V_{SS}$, which is gate OFF voltage, is inputted into a minus port V−, as power voltage. Also, a DC level adjustment unit A is formed by combining the $V_{ON}$ of pull-up voltage, the $V_{SS}$ of pull-down voltages, and the SCLK1 of an input.

A CLK01 signal outputted from the DC level adjustment unit A is finally outputted to the CLK1 through the buffer.

In a manner described above, the CLK2 is finally outputted if the SCLK2 is inputted into the non-invert port +IN_A of the amplification unit. Also, the INPUT signal is finally outputted if the SINPUT signal is inputted into the non-invert port +IN_A of the amplification unit.

Figure 9:
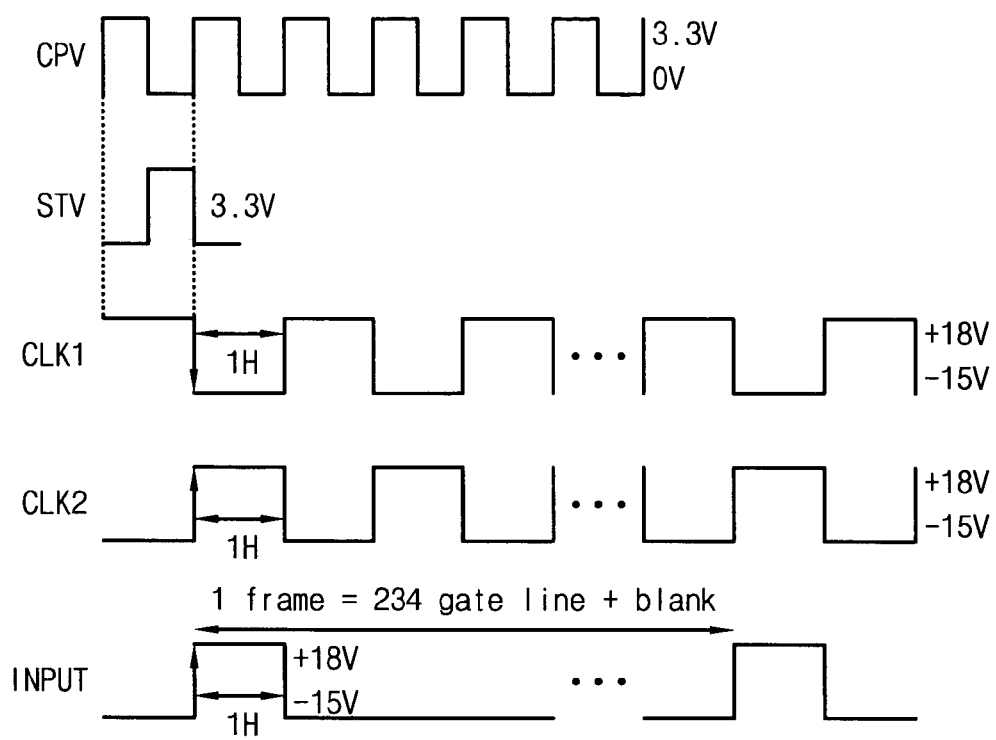
FIG. 9 is an operation timing view of driving circuit of a liquid crystal display device according to the present invention.

As described above, the output signal of the MUX 61*b* is inputted into the D port of the first flip/flop 61*c*, and the CPV signal is inputted into the D port of the first flip/flop 61*c* as the clock signal of the first flip/flop 61*c*. When the output signal of the MUX 61*b* has a high level, the first flip/flop 61*c* outputs a high signal while the CPV signal is rising. Otherwise, the first flip/flop 61*c* outputs an inverse signal of the output signal. At this time, the SCLK2 signal having a waveform identical to a waveform of the CLK2 signal shown in FIG. 9 is outputted as the output signal. It can be understood from FIG. 9 that the SCLK2 signal has a waveform having frequencies equal to a half of frequencies of the CPV signal.

In addition, if the SCLK2 passes through the inverter, the inverter outputs the SCLK1 having a waveform opposed to the waveform of the SCLK2. The waveform of the SCLK1 is identical to the waveform of the CLK1 shown in FIG. 9, but the level of the SCLK1 is different from the level of the CLK1 shown in FIG. 9.

In addition, the second flip/flop 61*d* uses the CPV signal as the clock signal, and the STV signal is inputted into the D port of the second flip/flop 61*d*, which is an input port, so that the SINPUT signal, which is outputted with a high level at a rising edge of the CPV and outputted with a low level in other portions of the rising edge of the CPV, is outputted from the second flip/flop 61*d*. The waveform of the SINPUT is identical to the waveform of the INPUT shown in FIG. 9, but the level of the SINPUT is different from the level of the INPUT shown in FIG. 9.

As mentioned above, levels of the SINPUT, the SCLK1, and the SCLK2 are, for example, a waveform of 3.3V, and frequencies of the SINPUT, the SCLK1, and the SCLK2 are identical to those of the INPUT, the CLK1, and the CLK2 shown in FIG. 9. However, levels of the SINPUT, the SCLK1, and the SCLK2 are different from those of the INPUT, the CLK1, and the CLK2 shown in FIG. 9.

Accordingly, the SCLK1 is inputted into the non-invert port +IN_A of the amplification unit, and a DC level of the SCLK1, which is connected to the $V_{ON}$ of pull-up voltage and connected to the $V_{SS}$ of pull-down voltage at the input port of the amplification unit, is adjusted by a varistor VR301. An adjustment range of the level is between the $V_{ON}$ level and the $V_{SS}$ level if the $V_{ON}$ is +18V, and the $V_{SS}$ is −15V.

The signal having the DC level adjusted through the above-mentioned manner is amplified according to a setting value of an AC level adjustment unit B in the amplification unit. At this time, the gain of the AC level adjustment unit B shown in FIG. 8 is regulated by the varistor VR300, so the amplification is performed.

The signal, in which the DC level and the AC level are adjusted, is outputted in the same manner as the INPUT, the CLK1, and the CLK2 signals shown in FIG. 9, and the amplified signal is inputted into the shift register through the buffer of an IC300.

As described above, the driving circuit of the liquid crystal display device according to the present invention has advantages as follows:

Firstly, in the driving circuit of the liquid crystal display device having the shift register therein, the signal inputted into the shift register has the adjusted DC level and AC level, so loss caused by a device can be compensated. In addition, loss caused by a resister of the shift register installed in the liquid crystal display device is also compensated, thereby improving the degree of freedom with respect to external circuits.

The preferred embodiment of the present invention has been described for illustrative purposes, and those skilled in the art will appreciate that various modifications, additions and substitutions are possible, without departing from the scope and spirit of the invention as disclosed in the accompanying claims.

What is claimed is:

1. A driving circuit of a liquid crystal display for applying a signal to a shift register installed in a gate driver IC, the driving circuit comprising:
    a clock generation unit outputting a first clock signal which is a gate clock signal, a second clock signal which is an inverse signal of the first clock signal, and a start pulse by receiving a gate clock signal and a start pulse; and
    a DC and AC level amplification unit amplifying the first and second clock signals and the start pulse after adjusting DC levels and AC levels of the first and second clock signals and the start pulse, and outputting the first and second clock signals and the start pulse to the shift register.

2. The driving circuit as claimed in claim 1, wherein the clock generation unit includes an inverter outputting the first clock signal by inversely converting the second clock signal, a MUX, into which an output signal of the inverter is inputted as an input signal, having an STV signal as a selection signal, a first flip/flop having an input port for receiving an output signal of the MUX and outputting the second clock signal by using a CPV signal as a clock signal, and a second flip/flop having an input port for receiving the STV signal and outputting the start pulse by using the CPV signal as the clock signal.

3. The driving circuit as claimed in claim 1, wherein the DC and AC level amplification unit includes a DC level adjustment unit for adjusting the DC level through a gate ON pull-up and a gate OFF pull-down by setting a gate ON signal with a pull-up voltage and a gate OFF signal with a pull-down voltage, an AC level adjustment unit for adjusting AC levels of the first and second clock signals and the start pulse having adjusted DC levels through adjusting a gain by using a variation resistance, and an amplification unit amplifying first and second clock signals and the start pulse having adjusted AC and DC levels through adjusting a gain by using a differential amplifier.

4. The driving circuit as claimed in claim 3, wherein the DC level is adjusted within a range between the gate ON voltage and the gate OFF voltage.

5. The driving circuit as claimed in claim 1, wherein the first and second clock signals and the start pulse inputted into the clock generation unit and the first and second clock signals and the start pulse inputted into the level shifter have waveforms identical to each other and levels different from each other.

* * * * *